United States Patent

[11] 3,596,187

[72] Inventor William J. Thompson
5363 Van Nuys Place, San Diego, Calif. 92109
[21] Appl. No. 880,313
[22] Filed Nov. 26, 1969
[45] Patented July 27, 1971
Continuation-in-part of application Ser. No. 684,265, Nov. 20, 1967, now abandoned.

[54] PULSE CODE GENERATOR
1 Claim, 4 Drawing Figs.

[52] U.S. Cl. 328/63, 328/37, 328/61, 178/79
[51] Int. Cl. H03k 1/18
[50] Field of Search 328/37, 60, 61, 62, 63; 178/79

[56] References Cited
UNITED STATES PATENTS

| | | | |
|---|---|---|---|
| 3,137,818 | 6/1964 | Clapper | 328/37 X |
| 3,238,462 | 3/1966 | Ballard et al. | 328/63 |
| 3,271,688 | 9/1966 | Gschwind et al. | 328/63 X |
| 3,335,406 | 8/1967 | Clark | 328/37 X |

*Primary Examiner*—John S. Heyman
*Attorney*—Richard K. MacNeill

ABSTRACT: A pulse code generator for generating morse code logic having a voltage-controlled clock pulse generator, the output of which is coupled as a shift pulse to a digital shift register and through a binary counter to the signal input of the digital shift register, each stage of the digital shift register having an output which can be selectably coupled to an output OR gate and to a feedback OR gate; the output of the feedback OR gate being coupled to the controlled input of the voltage-controlled clock pulse generator to control the voltage-controlled clock pulse generator's offtime or ontime by the presence or absence of a pulse at the control input; the code generated is determined by which stages of the digital shift register are coupled to the feedback OR gate and to the output OR gate.

INVENTOR.
WILLIAM J. THOMPSON
BY
Richard K. Macneill

INVENTOR.
WILLIAM J. THOMPSON
BY
Richard K. Macneill
ATTORNEY

PULSE CODE GENERATOR

RELATED APPLICATIONS

This is a continuation-in-part of my copending application filed Nov. 20, 1967, Ser. No. 684,265, now abandoned, for Pulse Code Generator.

BACKGROUND OF THE INVENTION

The present invention relates to a pulse code generator and more particularly to a pulse code generator in which the selected code is feedback controlled.

The prior art pulse code generators have, in the main, been clumsy electromechanical devices utilizing relays, etc., with their attendant disadvantages. An early attempt at a solid state electronic pulse code generator similar to the instant invention is disclosed in the U.S. Pat. No. 3,300,582, issued Jan. 24, 1967, to D. I. Himes et al., for a Solid State Identification Keyer. One main difference between the Himes, et al., patent and the instant device lies in their comparative complexities. In the Himes patent, a magnetic shift register and switching network is used to program either a dash generator or a dot generator in sequence.

According to the instant invention, a voltage-controlled clock generator is provided which is coupled to the shift pulse input of a digital shift register and through a binary counter to the signal input of the digital shift register. An output from each stage of the shift register is selectively coupled through a feedback OR gate back to the voltage-controlled clock generator. The clock generator circuitry being sensitive to this input will increase or decrease its on or off time depending upon whether or not a pulse is present at its control input. Hence, the output of the clock generator can be incrementally varied depending upon which stages of the shift register are coupled back to its control input through the feedback OR gate. An output OR gate than combines whichever stages of the shift register are desired to program the desired output code. It is only necessary to vary the coupling of the outputs of the individual stages of the shift register to vary the output code. This extremely simple and versatile system does away with the necessity of a separate dash and dot generator and reduces the logic to a minimum.

An object of the present invention is the provision of a pulse code generator which utilizes feedback control for code selection.

Another object of the present invention is the provision of a pulse code generator which is extremely versatile.

Other objects and many of the attendant advantages of this invention will be readily appreciated as the same becomes better understood by reference to the following detailed description when considered in connection with the accompanying drawings in which like reference numerals designate like parts throughout the FIGURES thereof and wherein.

Figure 1:
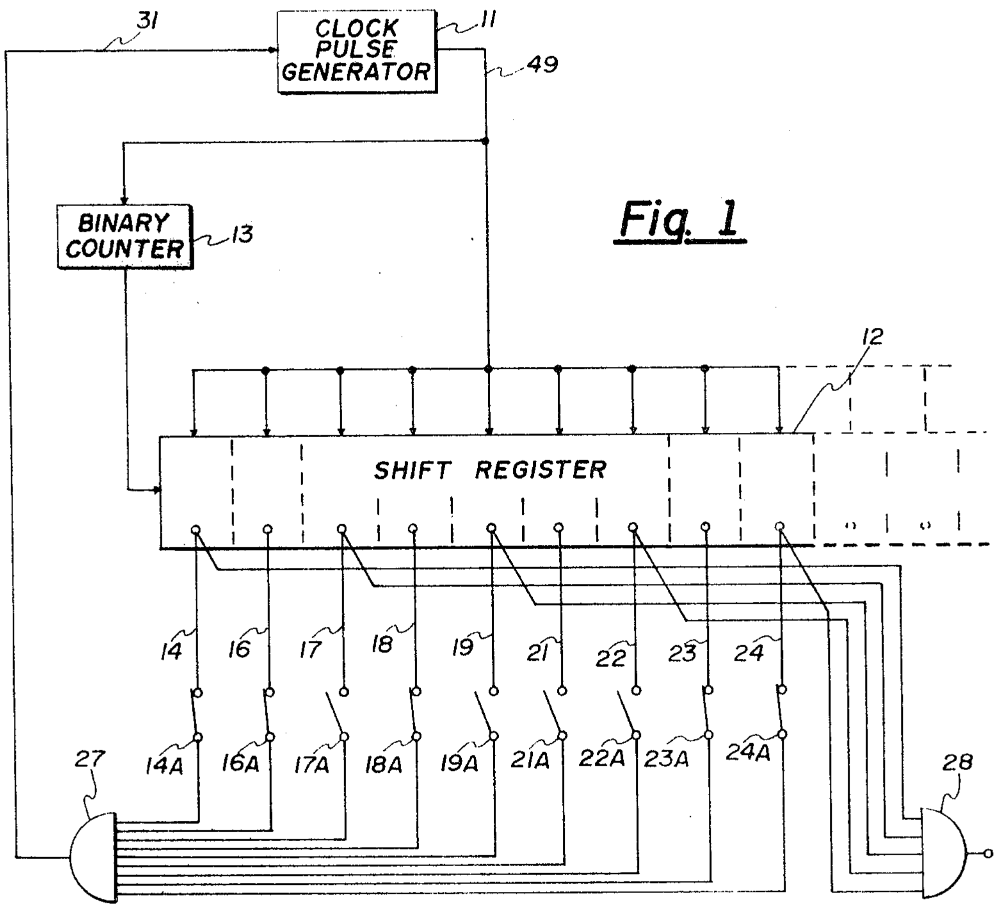
FIG. 1 is a block diagram of the preferred embodiment of the present invention.

Referring to FIG. 1, a voltage-controlled clock pulse generator 11 has outputs connected to the shift input of digital shift register 12 and to the input of binary counter 13. The output of binary counter 13 is coupled to the start and reset input of shift register 12. Shift register 12 has a plurality of stages having outputs numbered 14, 16, 17, 18, 19, 21, 22, 23 and 24 coupled through a plurality of switches **14*a*, 16*a*, 17*a*, 18*a*, 19*a*, 21*a*, 22*a*, 23*a* and 24*a*, respectively. Outputs 14, 17, 19, 22 and 24 are all coupled directly to the inputs of OR gate 28. The other side of switches 14*a*, 16*a*, 17*a*, 18*a*, 19*a*, 21*a*, 22*a*23*a* and 24*a* are combined in OR gate 27. The output of OR gate 27 is coupled to the control input of voltage-controlled clock generator 11**.

Figure 2:
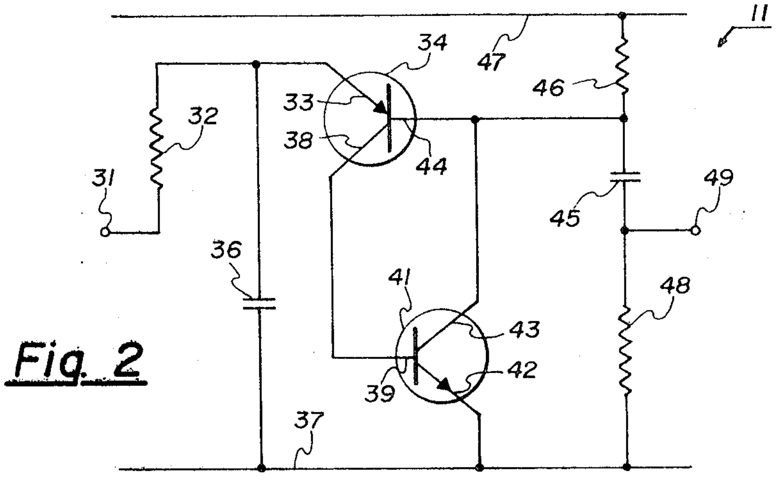
FIG. 2 is a schematic diagram of the voltage-controlled clock generator of FIG. 1.

Referring to FIG. 2, a voltage-controlled clock generator is shown generally at 11 having its input at terminal 31 which is coupled through resistor 32 to emitter 33 of transistor 34 and through capacitance 36 to negative bus 37. Collector 43 of transistor 41 is connected to base 44 of transistor 34, through resistance 46 to positive bus 47, through resistance 48 to negative bus 37, and to output terminal 49. Naturally, the output taken at terminal 49 would be differentiated to form the pulses shown in wave forms A and A′ of FIG. 4.

Figure 3:
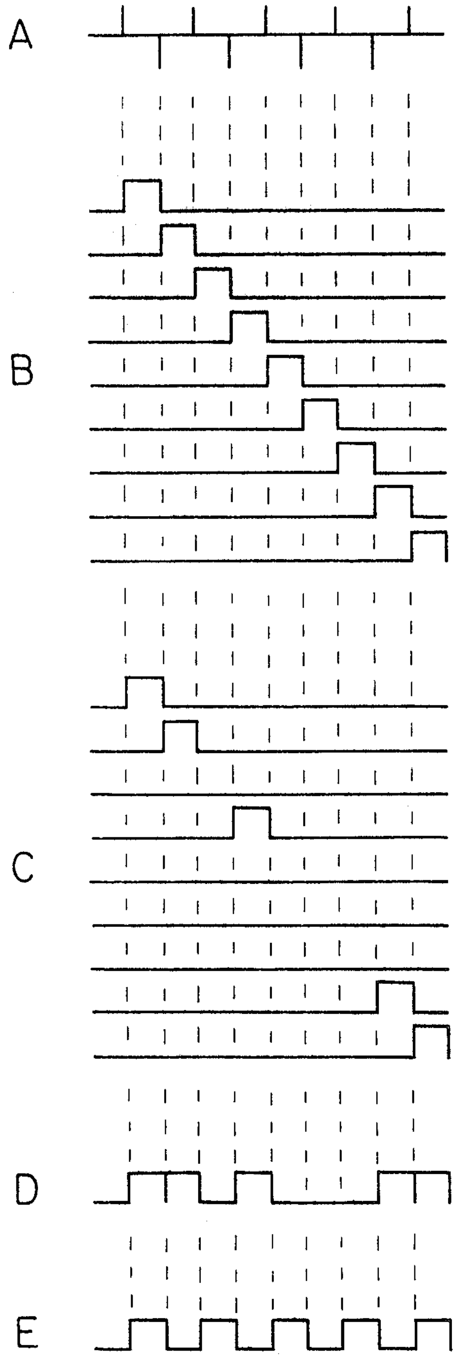
FIG. 3 is a graph of waveforms as they would appear throughout the block diagram of FIG. 1 without feedback.

Referring to FIG. 3, a plurality of waveforms are shown at A, B, C, D and E having a common time base.

Figure 4:
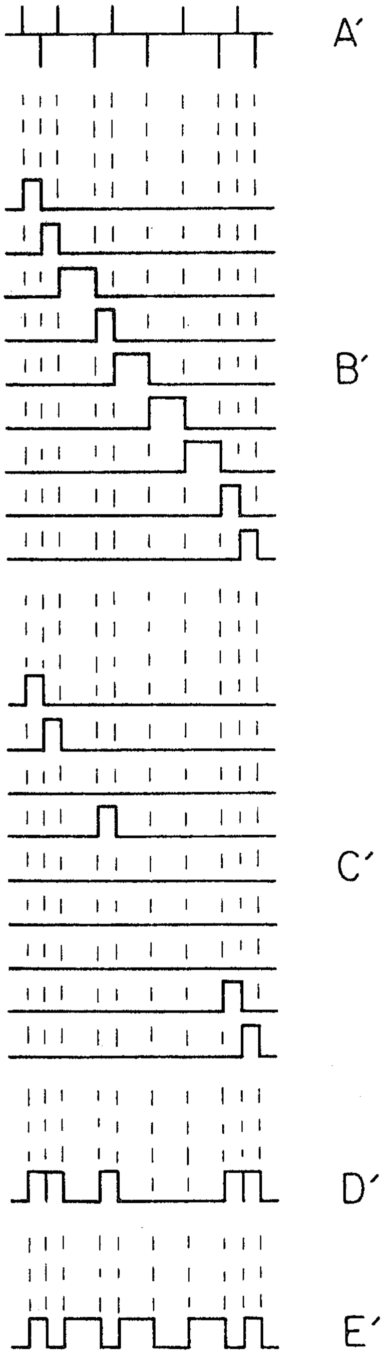
FIG. 4 is a graph of waveforms seen throughout the block diagram of FIG. 1 in a typical mode of operation.

Referring to FIG. 4 a plurality of waveforms A′, B′, C′, D′ and E′ are shown having a common time base with times $t_1$, $t_2$, $t_3$, $t_4$, $t_5$, $t_6$, $t_7$, $t_8$, $t_9$ and $t_{10}$ indicated as dotted lines.

OPERATION

Referring now to FIGS. 1 and 3, the system operation will be described assuming that the output from OR gate 27 is not connected to clock generator 11 and clock generator 11 puts out a steady frequency of clock pulses as shown at waveform A of FIG. 3. These clock pulses are applied to shift register 12 to shift the individual stages from stage 14 down to stage 24. The clock pulses are also applied to binary counter 13, the output of which is a single pulse occurring after the shift register has advanced to stage 24; this pulse resets the register and starts the next sequence of advancing steps through the shift register from stage 14 down to stage 24 again. The nine stages in operation are indicated by the waveforms shown at B in FIG. 3 as advancing in time with the clock pulses of waveform A. These square waves will then appear at the output lines of the individual stages 14 through 24. Assume that switches **14*a*, 16*a*, 18*a*, 23*a* and 24*a* are closed, and switches 17*a*, 19*a*, 21*a* and 22*a* are open, as shown. Further assuming that every other stage beginning with 14 is connected as shown to the input of OR gate 28, the waveforms appearing at the input of OR gate 27 are those indicated at C in FIG. 3. Notice only the waveforms corresponding to the closed switches appear. At the output of OR gate 27, the waveforms will be collected as shown at D in FIG. 3. Since this line is disconnected to clock pulse generator shown at D in FIG. 3. Since this line is disconnected to clock pulse generator 11, they will have no effect on clock pulse generator 11, and the input waveform and output waveform at OR gate 28 will be that as shown as E in FIG. 3**. In this instance, the output would be a series of dashes with a long pause separating each dash corresponding to a letter separation.

Now assuming that the output of OR gate 27 is connected to the control input of voltage-controlled clock pulse generator 11, the waveforms will appear as shown in FIG. 4. W ıen a signal appears at the output of OR gate 27, and at the control input of voltage-controlled clock pulse 11, the frequency of clock pulse 11 is increased as shown between times $t_1$ and $t_2$, and $t_2$ and $t_3$. Hence, the first two outputs from stages 14 and 16 being connected to the input of OR gate 27 will cause a short pulse being formed at the output of binary counter 13 due to the increased clock frequency. The next time increment, $t_3$ and $t_4$, corresponding to the output from shift register stage 17 being disconnected, the clock pulse generator 11 will not see a control input and will put out a dash pulse as shown as the third waveform from the top in B′ of FIG. 4. At time $t_4$, stage 18 will have an output and the clock pulse generator frequency will be again increased resulting in a short pulse being generated by binary counter 13. $T_5$ will correspond to shift register stage 19 which is not connected resulting in another dash pulse being generated by binary counter 13 as shown in the fifth waveform from the top of the set B′ of FIG. 4. The same is true at times $t_6$ when the longer space required between letters is generated and $t_7$ when a dash is generated. At time $t_8$, stages 23 and 24 of shift register 12 present an input to OR gate 27 which, again, increases the frequency of clock pulses at the output of clock pulse generator 11, resulting in dot pulses being generated by binary counter 13.

Now remembering that only stages 14, 17, 19, 22 and 24 are connected to the input of OR gate 28, OR gate 28 will see every other pulse of the waveforms B1, as shown in E'. For this particular coding of the outputs of shift register 12, a dot, short space, dash, short space, dash, long space, dash, short space, dot, short space, will be generated. This pattern will repeat itself until the different switch settings at the outputs of shift register 12 can be utilized, the nine-stage illustration being exemplary, only. Should more stages be built in than are needed or utilized, the output can simply be shorted to ground of those unused stages to provide no code pattern until the binary counter resets the shift register and starts a new cycle. If desired, the start and reset pulse can be taken from an earlier stage of the binary counter, causing a recycle of the end of a shorter code increasing the overall repetition rate. In such a case, the unused stages of the shift register need not be grounded since the register will be reset and the sequence reinstated before the pulses advance into the unused stages.

Referring now to FIG. 2, the voltage-controlled clock pulse generator 11 is shown in schematic form with input terminal 31 and output terminal 49, these terminals being identical with terminals 31 and 49 in FIG. 1. As can be seen, PNP transistor 34 and NPN transistor 41 form a conventional free-running multivibrator, the frequency of which is controlled by the RC charging rate of capacitor 36 and by the voltage toward which it is charging. By varying this voltage at input terminal 31, the frequency of the clock pulse generator is likewise varied. Again, this circuitry is merely exemplary and any suitable pulse generator which can be controlled by a feedback signal can be utilized. Capacitor 45 and resistance 48 differentiate the output seen at terminal 49.

In the preferred embodiment, if OR gate 28 has N inputs, shift register 12 will have 2N stages, OR gate 27 will have 2N inputs and binary counter 13 will have 2N and 1 stages.

It should be understood, of course, that the foregoing disclosure relates to only a preferred embodiment of the invention, and that it is intended to cover all changes and modifications of the example of the invention herein chosen for the purposes of the disclosure which do not constitute departures from the spirit and scope of the invention.

I claim:

1. A pulse code generator comprising:

a variable frequency clock pulse generator having a control input and an output;

a binary counter having an output and an input connected to said clock pulse generator output;

a shift register having a plurality of stages and an input coupled to said binary counter output, said shift register having coupling means connected between at least one of said plurality of stages outputs and said pulse generator control input for controlling the frequency of said clock pulse generator; and an output means coupling alternate outputs of said plurality of stages of said shift register.